US010652051B2

(12) United States Patent
Simpson et al.

(10) Patent No.: US 10,652,051 B2
(45) Date of Patent: May 12, 2020

(54) MEASUREMENT SYSTEM AND CALIBRATION METHOD WITH WIDEBAND MODULATION

(71) Applicant: Maury Microwave, Inc., Ontario, CA (US)

(72) Inventors: Gary R. Simpson, Fontana, CA (US); Sathya Padmanabhan, Glendora, CA (US); Steven M. Dudkiewicz, Toronto (CA); M. Tekamül Büber, Anaheim, CA (US); Giampiero Esposito, Pasadena, CA (US)

(73) Assignee: Maury Microwave, Inc., Ontario, CA (US)

( * ) Notice: Subject to any disclaimer, the term of this patent is extended or adjusted under 35 U.S.C. 154(b) by 29 days.

(21) Appl. No.: 16/115,158

(22) Filed: Aug. 28, 2018

(65) Prior Publication Data
US 2019/0081822 A1    Mar. 14, 2019

Related U.S. Application Data

(60) Provisional application No. 62/561,618, filed on Sep. 21, 2017, provisional application No. 62/559,455, (Continued)

(51) Int. Cl.
H04L 25/02    (2006.01)
G01R 31/319    (2006.01)
(Continued)

(52) U.S. Cl.
CPC .......... H04L 25/0278 (2013.01); G01R 27/32 (2013.01); G01R 31/2822 (2013.01); G01R 31/31905 (2013.01); H04L 25/0298 (2013.01)

(58) Field of Classification Search
CPC ...... G01R 35/005; G01R 27/32; G01R 27/28; G01R 31/2822; H04L 25/02
See application file for complete search history.

(56) References Cited

U.S. PATENT DOCUMENTS 75,480,692      6/2009  Simpson
9,252,738 B1    2/2016  Tsironis
(Continued)

OTHER PUBLICATIONS

Marchetti, Mauro et al, Examples of High-Speed Harmonic Load Pull Investigations of High-Efficiency GaN Power Transistors, 2015 IEEE International Conference on Microwaves, Communications, Antennas and Electronic Systems (Comcas), Nov. 30, 2015 (Nov. 30, 2015), pp. 1-29, XP055525935, DOI:10.1109/COMCAS.2015. 7360409 ISBN: 978-1-4799-7473-3 p. 7-p. 16.
(Continued)

Primary Examiner — Alvaro E Fortich
Assistant Examiner — Zannatul Ferdous
(74) Attorney, Agent, or Firm — Larry K. Roberts

(57) ABSTRACT

A load pull system and method for calibrating the system and conducting measurements on a Device Under Test (DUT). The system includes at least one passive tuner; and a modulated signal connected to the DUT input. The passive tuner is calibrated at multiple frequencies within the modulation bandwidth of the modulated signal. The impedance and measured quantities such as power at the DUT reference plane are determined using tuner s-parameters at multiple frequencies within the modulation bandwidth.

25 Claims, 10 Drawing Sheets

Related U.S. Application Data filed on Sep. 15, 2017, provisional application No. 62/556,256, filed on Sep. 8, 2017.

(51) Int. Cl.
  *G01R 27/32* (2006.01)
  *G01R 31/28* (2006.01)

(56) References Cited

U.S. PATENT DOCUMENTS

| | | | |
|---|---|---|---|
| 9,625,556 B1 | 4/2017 | Tsironis | |
| 9,921,253 B1* | 3/2018 | Tsironis | G01R 27/32 |
| 10,281,510 B1* | 5/2019 | Tsironis | G01R 31/2822 |
| 2003/0058058 A1* | 3/2003 | Verspecht | G01R 27/28 |
| | | | 333/17.3 |
| 2012/0049970 A1 | 3/2012 | Simpson | |
| 2012/0161784 A1 | 6/2012 | Benedikt | |
| 2016/0124032 A1* | 5/2016 | Simpson | G01R 29/26 |
| | | | 702/69 |

OTHER PUBLICATIONS

Focus Microwaves: WLAN and WiMAX Integrated Solutions, Jan. 31, 2007 (Jan. 31, 2007), pp. 1-5, XP055526003, Focus Microwaves website Retrieved from the Internet: URL:https://21vd3q21bbmblq51to1wevcw-wpengine.netdna-ssl.com/wp-content/uploads/2017/04/PN-83-WLAN-and-WiMAX-Integrated-Solutions.pdf [retrieved on Nov. 22, 2018] pp. 1-2; figures 1-2.

International Search Report and Written Opinion of the International Searching Authority, for International Application PCT/US2016/050062, dated Dec. 3, 2018.

\* cited by examiner

MEASUREMENT SYSTEM AND CALIBRATION METHOD WITH WIDEBAND MODULATION

This application claims the benefit of U.S. Provisional Application No. 62/556,256 filed Sep. 8, 2017; and U.S. Provisional Application No. 62/561,618, filed Sep. 21, 2017; and U.S. Provisional Application No. 62/559,455, filed Sep. 15, 2017, the entire contents of which applications are hereby incorporated by reference.

BACKGROUND

Passive load pull systems have been widely used to characterize microwave devices. Load pull involves measuring a Device Under Test (DUT) under controlled conditions, including controlled impedances seen by the DUT. The controlled impedances may include the impedance on any port of the DUT, and they may be at the fundamental operating frequency or at a harmonic frequency. A typical load pull measurement would measure the DUT performance at multiple impedances to show the effect of impedance on the DUT performance. Some other conditions that may be controlled and/or varied include frequency, power level, bias values, or temperature.

In this document, impedance, reflection, or reflection coefficient are all used as general terms to describe the RF termination seen at an RF port. They are functions of the signal coming out of an RF port and the signal at the same frequency coming into the port. Reflection coefficient is related to impedance by the expression $$Z = \frac{(1+\Gamma)}{(1-\Gamma)}$$

where Z is the impedance and r is the reflection coefficient. Both terms contain the same information, so that if one is known, the other is also known. Therefore, in this document they will be used interchangeably. Also, the terms "RF port" and "reference plane" are used interchangeably in the context of impedance control.

Impedance tuners are commonly used in load pull measurement systems working at radio frequency (RF), microwave (MW) frequencies, and millimeter-wave frequencies. In this document, RF will mean the entire spectrum of frequencies, including microwave frequencies, millimeter-wave frequencies, and higher.

An impedance tuner may include a transmission line, such as a slabline, coaxial line, or waveguide line. Placement of capacitive objects such as probes along the transmission line alters the impedance or electronic profile seen by the DUT which is connected or coupled to the tuner transmission line. The object may be moved axially along the transmission line to affect the phase, while movement of the object transverse to the transmission line will alter impedance magnitude or reflection effects. In automated tuners, motors are used to position the capacitive objects along the transmission line and transverse to the transmission line.

A "passive RE component" does not require energy to operate, except for the available AC circuit it is connected to. A "passive RF module" is incapable of power gain and is not a source of energy. A passive impedance tuner is one where the RF portion of the tuner consists entirely of passive components, so that the tuner itself is also a passive component.

The RF portion of a tuner is the portion containing the RF signal paths, in which RF signals may be present. Passive impedance tuners may control impedance by moving passive objects, such as a capacitive probe, in a passive transmission line. They may also control impedance with solid state switches, which are passive components. A "tuner state" is one specific hardware setting of the tuner which affects the RF portion of the tuner.

Active tuning load pull systems have also been used, but not as widely because of the complexity and cost. Active tuning provides some advantages, including capability to present a higher reflection coefficient than is possible with a passive tuning system, even with fixture losses or other circuit losses. The impedance seen by the DUT can be all the way to the edge of the Smith chart, and even outside the Smith chart, if desired.

In this document, a "tuner system" will refer to a RF measurement system which uses some kind of tuner or tuners to control impedance at a reference plane or planes, e.g. an impedance seen by a DUT.

An "automated tuner" may be computer controlled; a "manual tuner" is controlled manually by the user.

A "passive tuner" controls the impedance at a reference plane with a passive reflection. This means that it reflects a portion of a signal coming out of a port back into that port. It controls the magnitude or phase of the reflected signal by changing RF hardware settings. The maximum reflection is limited by the physical hardware and losses between the tuner and the DUT reference plane.

A passive tuner may be automated with electronic control, but the control circuits are not part of the RF signal path(s). Therefore, electronic control circuits, electric motors, electronic interfaces, and any other aspect of the tuner outside of the RF portion of the tuner do not change the fact that the tuner is passive.

An "active tuner" controls an impedance at a reference plane by feeding a signal back to that reference plane with a specific magnitude and phase relative to the signal from that reference plane. In the context of conducting measurements on a DUT, the active tuner controls the impedance seen by the DUT by feeding a signal back to the DUT with a specific magnitude and phase relative to the signal from the DUT. It would normally use a signal that is either generated or amplified external to the DUT. The active tuner is said to be operating, or controlling the impedance, at the frequency of the "active" signal. In principle, the maximum effective reflection can be up to or even greater than unity. In practice, this is limited by the amount of power generated by the measurement system that can be fed back to the DUT to synthesize that impedance.

A "passive load pull system" means a measurement system using passive tuners, with no active tuners.

In load pull measurements, a signal is applied to or coming from the DUT. Sometimes this signal can be a CW signal, which means that it contains only one fundamental frequency. But sometimes, the signal is a modulated signal, which means that it may contain many frequencies, spread out over the modulation bandwidth. Modulation is important, because some form of modulation is required for a signal to contain or transmit any information. Therefore, all normal signals used in radios or wireless applications will be modulated.

In the prior art, passive tuners have been characterized (or calibrated) by measuring the tuner's 2-port s-parameters at a fundamental center frequency. From the 2-port s-parameters, the 1-port reflection coefficient seen by the DUT can be known. In some cases, the tuner calibration may consist of measuring the 1-port reflection coefficient at the fundamental frequency directly. Although one tuner calibration may cover many fundamental frequencies, they are only used one at a time.

If the signal used to test the DUT was a modulated signal, the known reflection coefficient would be correct at the center frequency of the modulation, but not at other frequencies within the modulation bandwidth. Likewise, de-embedding of measured data from an instrument through the tuner would also be accurate at the center frequency of the modulation but not at other frequencies within the modulation bandwidth. In the prior art, this deviation was ignored when using passive tuners, because it was generally a small effect when the modulation bandwidth was small.

In recent years, wideband modulation bandwidths are being used to transmit high amounts of data. This can cause significant accuracy problems with passive load pull measurements, because the wide bandwidth makes the impedance deviation over the bandwidth to be significant.

In the prior art, this problem of measurement error due to impedance deviation over a wide bandwidth has been solved with active tuning, but this requires a much more complex and expensive system than a passive tuner system.

This invention solves this problem of measurement errors due to impedance deviation over a wide modulation bandwidth when using passive tuners.

BRIEF DESCRIPTION OF THE DRAWINGS

Features and advantages of the disclosure will readily be appreciated by persons skilled in the art from the following detailed description when read in conjunction with the drawings wherein.

DETAILED DESCRIPTION

Figure 1:
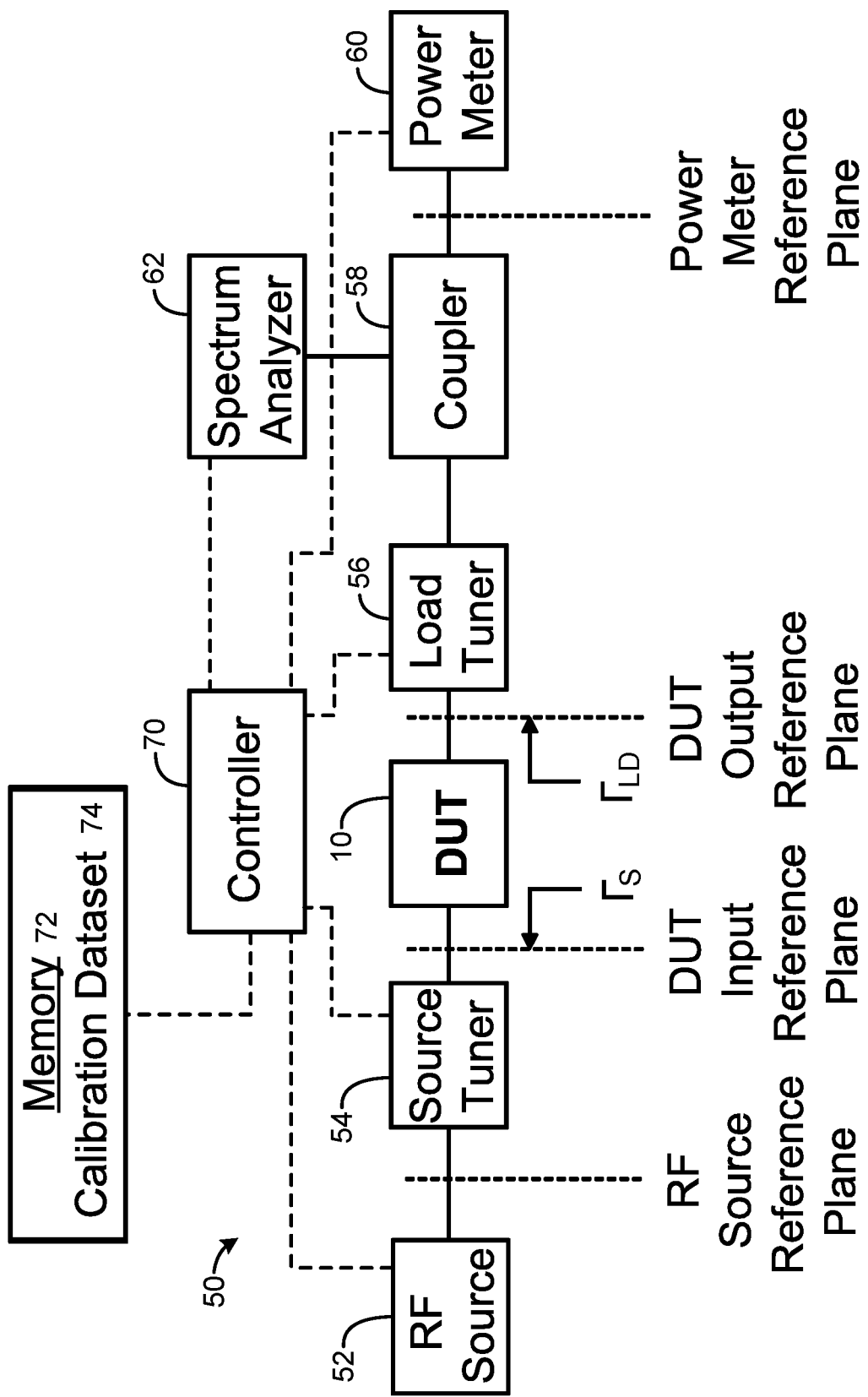
FIG. 1 shows a block diagram of a basic load pull system.

In the following detailed description and in the several figures of the drawing, like elements are identified with like reference numerals. The figures are not to scale, and relative feature sizes may be exaggerated for illustrative purposes.

FIG. 1 shows a block diagram of the RF signal path in a basic load pull system 50. The RF source 52 generates a signal to drive the DUT 10 input, and that signal may be a CW signal or a modulated signal. Between the RF source and the DUT input port is the source tuner 54, which can be adjusted (typically under software control by controller 70) to set the impedance $\Gamma_S$ seen by the DUT input port. Connected to the DUT output port is the load tuner 56, which can be adjusted (typically under software control) to set the impedance $\Gamma_{LD}$ seen by the DUT output port. Between the load tuner and the power meter 60 is a coupler 58, which samples the signal coming from the load tuner, and connects it to the spectrum analyzer 62 to show the signal spectrum. Finally, after the coupler is the power meter 60 which measures the output power. The measured output power is de-embedded through the s-parameters of the load tuner 56 and coupler 58 to get the actual delivered output power at the DUT Output Reference Plane for any given setting of the load tuner. The controller 70 may be a standalone computer such as a pc, or implemented in the spectrum analyzer or one of the tuners.

Figure 2:
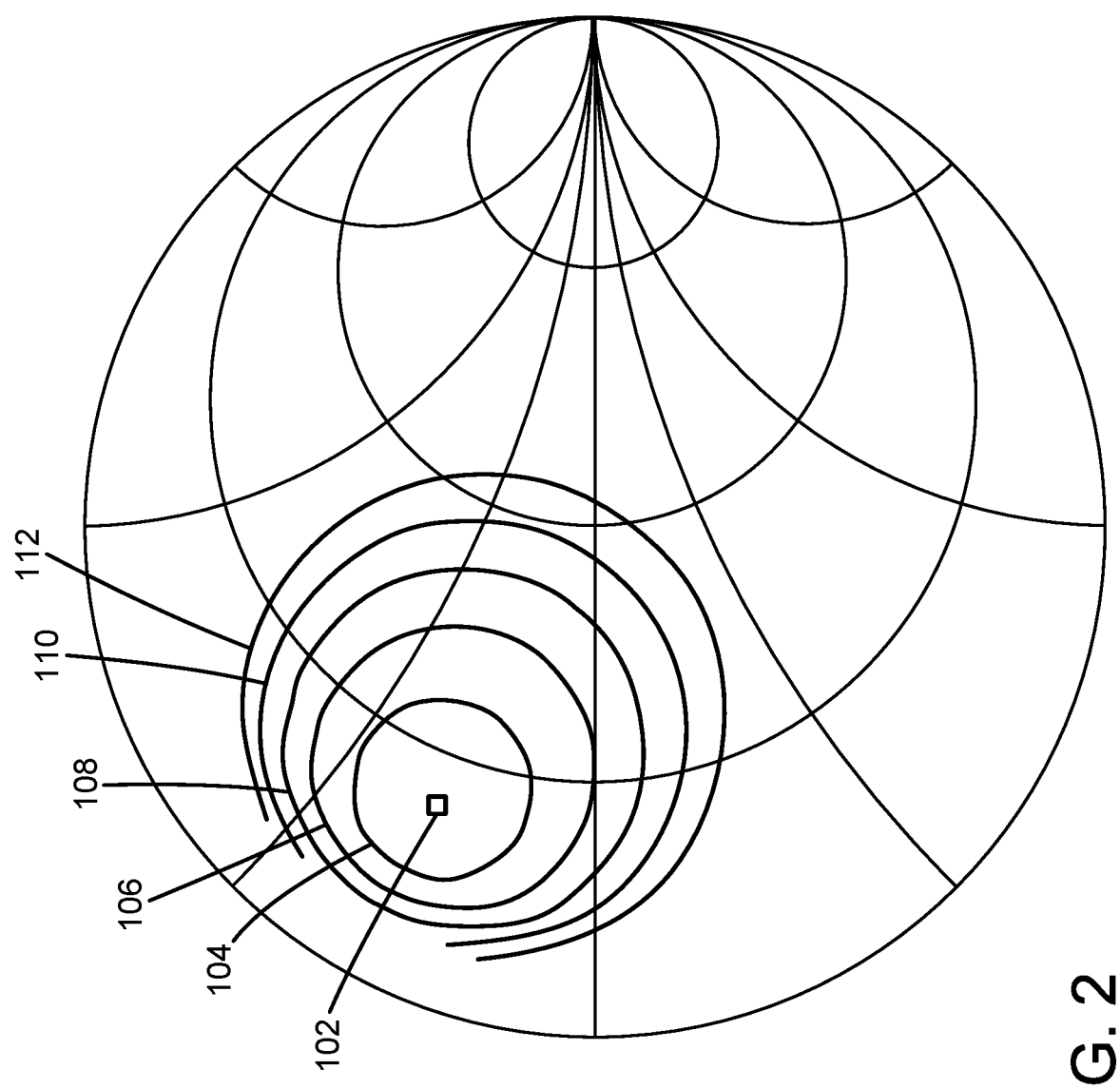
FIG. 2 shows a set of contours of data taken with a CW load pull system.

FIG. 2 shows a set of output power contours 104, 106, 108, 110, 112 from data measured with a prior art continuous wave (CW) load pull system. They show how output power varies as a function of impedance. The contours are plotted on a Smith chart, which is a two-dimensional graph of impedance, well known in the art. Load pull systems can show contours of many different parameters in a similar way. For this document, output power will be used as an example.

The small square 102 in FIG. 2 is plotted at the impedance that provides the maximum output power, also called the optimum impedance (for output power). As the impedance presented to the DUT at the DUT Output Reference Plane moves away from the optimum in any direction, the output power will decrease. The closest contour 104 surrounding the optimum shows the set of impedances where the output power is decreased from the optimum by 0.5 dB. Each succeeding contour 106, 108, 110, 112 farther from the optimum shows the set of impedances where the output power is decreased by an additional 0.5 dB from the prior contour.

The data plotted in FIG. 2 was taken with a CW signal applied to the DUT input. A CW signal is one with only one single frequency component, as shown in the spectrum graph of FIG. 3. The tuner s-parameters of all the impedance tuners were calibrated at that frequency, so the impedances presented to each of the DUT ports are known at that frequency. The power was measured at the Power Meter Reference Plane and de-embedded to the DUT Output Reference Plane using the same calibrated tuner s-parameters and the calibrated s-parameters of the coupler, so the output power at the DUT Output Reference Plane was correctly known.

To measure the data shown in FIG. 2, the load tuner 56 was moved to an impedance (known from the calibration), and the output power resulting from that load impedance was measured with the power meter and de-embedded to the DUT Output Reference Plane. This was then repeated for multiple load impedances corresponding to different load tuner calibrated settings. After all of the power measurements at the various impedances are complete, the output power variation due to load impedance change is known (from prior art methods) and the contours may be drawn.

An important part of the output power measurement process just described is taking the power measured at the Power Meter Reference Plane, and de-embedding it to the DUT Output Reference Plane. This process is well known in the art as long as the s-parameters of the output tuner 56, coupler 58, and power meter 60 input reflection of FIG. 1 are known from the system calibration, for every setting of the tuner that is used. These tuners settings can include tuner settings that are interpolated between calibrated tuner positions at that same frequency. If a CW signal is used and the tuner is calibrated at the CW frequency, this condition is satisfied.

Figure 4:
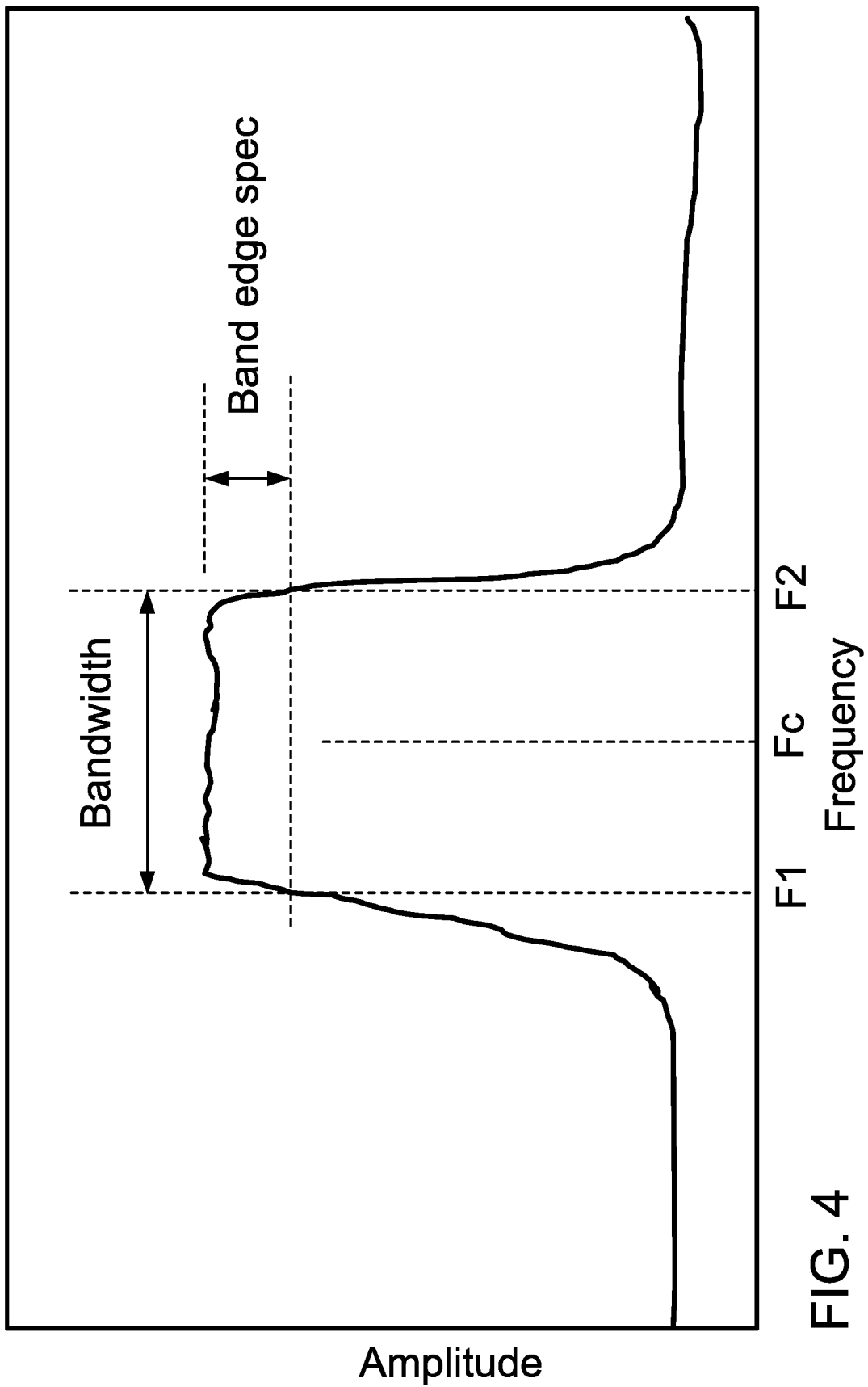
FIG. 4 shows a spectrum graph with a modulated signal.

FIG. 4 shows the spectrum of a modulated signal. Modulated signals are required in order to transmit information with a signal, and are therefore very important for any type of communication (wired or wireless). The modulated signal has a bandwidth, called the modulation bandwidth, and it contains many frequencies within that bandwidth. The modulated signal has a center frequency $F_C$ (also called the carrier frequency) at the center of the band.

The amplitude of a modulation band does not typically drop to zero (which equals negative infinity in dB units) instantly at the band edges, but will have some slope. By convention, the bandwidth is defined as having band edges F1 and F2, which are the frequencies on each side where the signal drops from a peak value by a specified amount, shown in FIG. 4 as the "band edge spec." A common band edge spec is 3 dB. The bandwidth is therefore defined as F2−F1. This is also called the absolute bandwidth.

Modulation bandwidths are sometimes specified as a relative bandwidth. This is defined as the bandwidth divided by the center frequency. Based on FIG. 4, the relative bandwidth is $$BW_R = (F2-F1)/F_C.$$

This can be expressed in percent by multiplying by 100.

Figure 3:
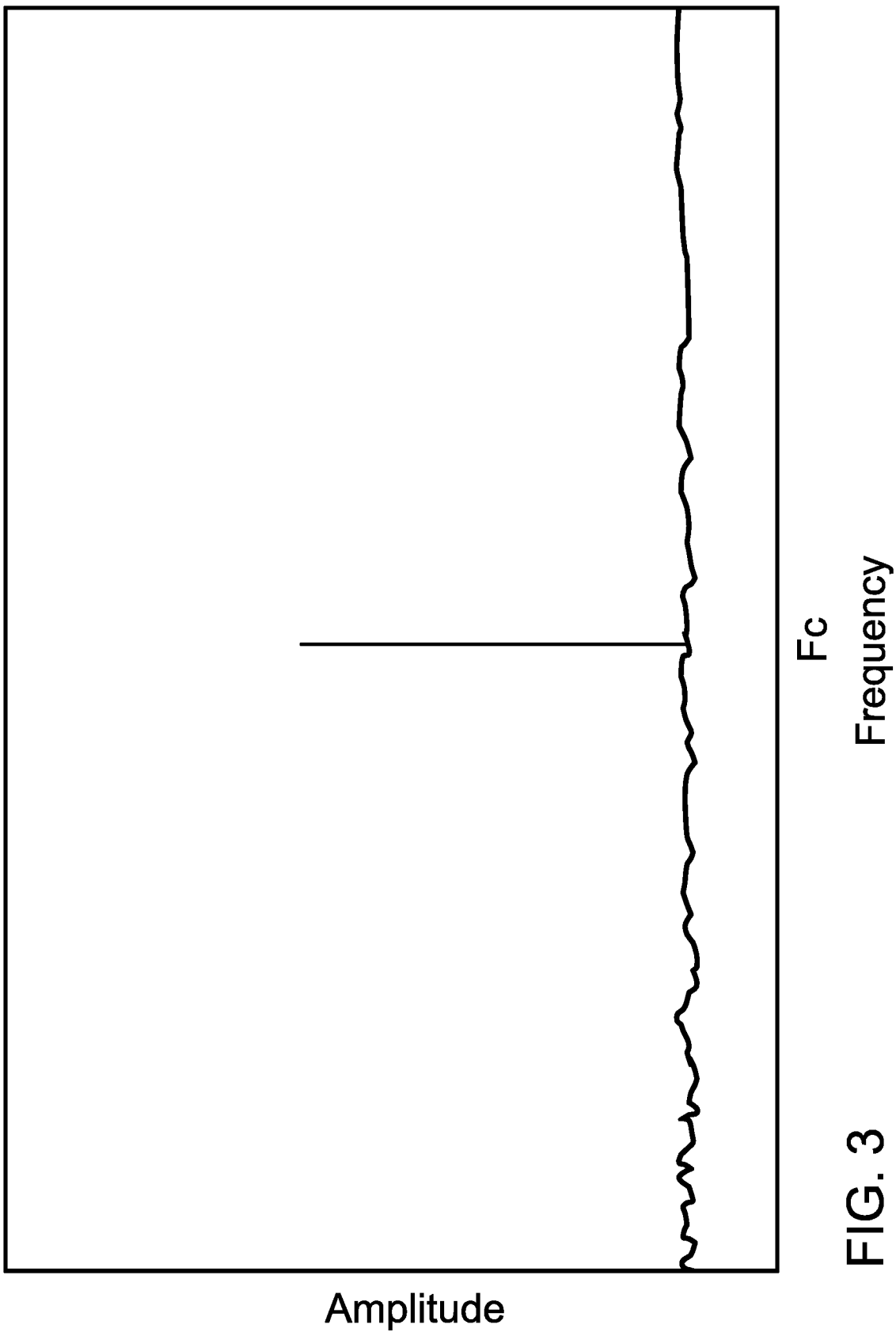
FIG. 3 shows a spectrum graph with a CW signal.

Note that, in a measured spectrum, as in FIG. 3 and FIG. 4, the amplitude outside of the frequency or frequency band drops only to the noise floor of the measuring instrument.

Figure 5:
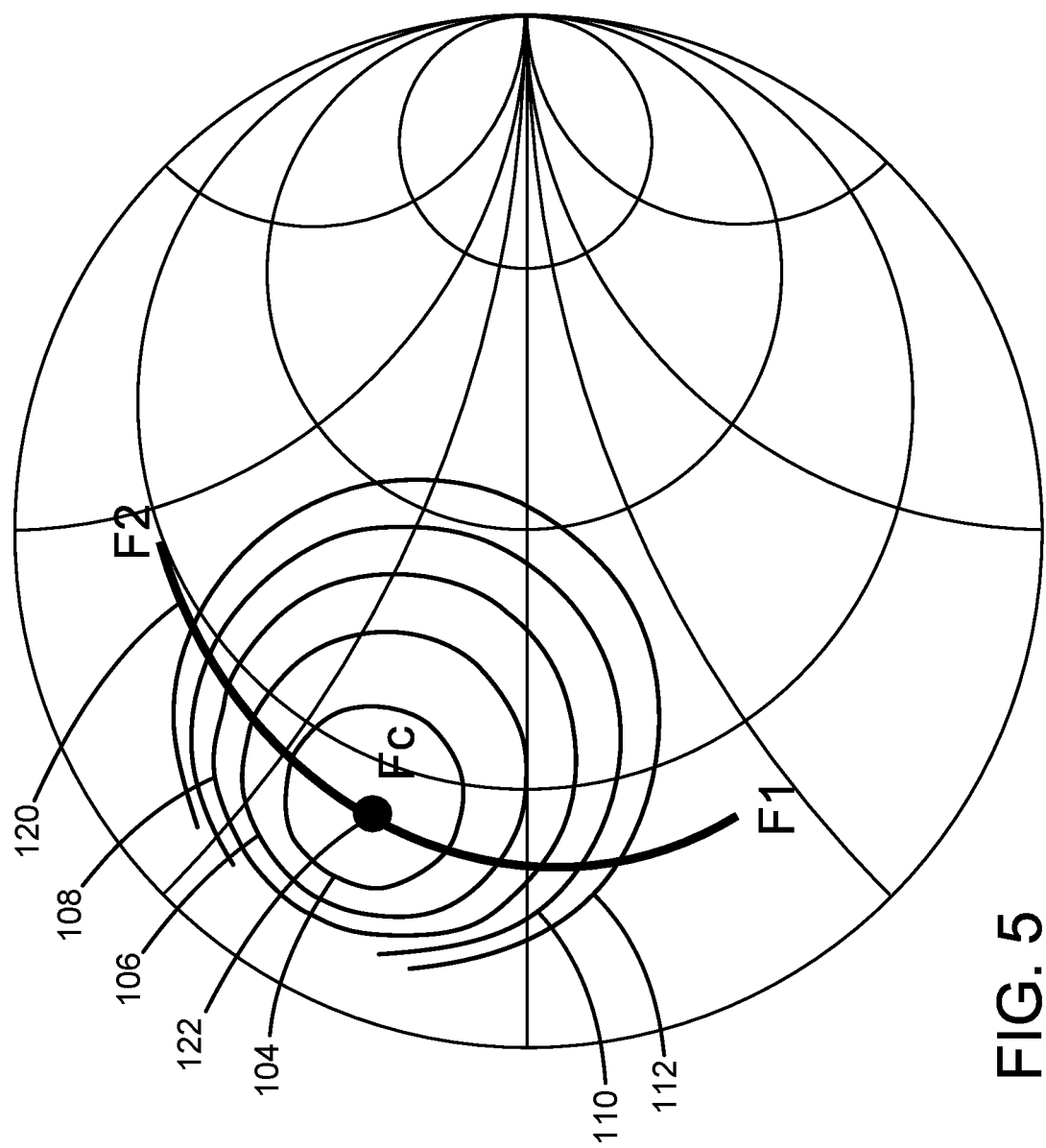
FIG. 5 shows a curve representing the unknown impedance variation of a passive tuner over a modulation bandwidth, calibrated only at the center frequency. It overlays a set of load pull contours to show the impedance context.

The problem in the prior art with using a modulated signal with passive tuners comes from the fact that each tuner 54, 56 has been calibrated only at the center frequency $F_C$. This problem is illustrated in FIG. 5, where the bold arc 120 shows the impedance swing (or deviation) of the impedance presented by the passive load tuner 56 over the modulation bandwidth, with the bold dot 122 showing the impedance at $F_C$ based on the calibrated tuner at that frequency. The impedance swing away from $F_C$ is not known. In this example, the load tuner 56 setting is the same as the setting that provided the optimum impedance with the CW load pull with the data shown in FIG. 2. The CW contours from FIG. 2 are included only to show the context of the swept impedance vs. frequency on the Smith chart relative to the data at $F_C$.

From FIG. 5, it is clear that the impedances at frequencies away from $F_C$ are different from the impedance at $F_C$. This is because the s-parameters of the load tuner 56 away from $F_C$ are different from the s-parameters of the load tuner 56 at $F_C$. This will also be true of any other passive tuner in the measurement setup, including the source tuner 54 in FIG. 1, as well as other system components such as the coupler 58. Therefore, de-embedding the measured output power at frequencies away from $F_C$ will be incorrect.

If the modulation bandwidth is small, the impedance deviation in FIG. 5 may be small, and ignoring the problem may still yield useful results. This approach was used in the design of many of the early cell phone and wireless communication systems where the modulation bandwidth was small. For example, the 1 G cell phone system AMPS had 30 KHz bandwidth per channel, the 2 G cell phone system GSM had 200 KHz bandwidth per channel, the 3 G cell phone system CDMA had 1.25 MHz bandwidth per channel and the 3 G cell phone system WCDMA had 5 MHz bandwidth per channel. This 5 MHz bandwidth at 900 MHz is a relative bandwidth of 0.56%. The newer 4 G phone system LTE has up to 20 MHz bandwidth per channel, so the effects become more pronounced, and future 5 G systems expect to use much wider bandwidths. Measurement errors due to the impedance deviations of FIG. 5 with the newer wideband modulation systems can result in poor circuit designs.

Another problem with using a passive tuner with a modulated signal is the drive signal at the DUT Input Reference Plane. The RF Source 52 in FIG. 1 can generate a modulated signal with a desired power and phase of the signal across the modulation bandwidth at the RF Source Reference Plane. But the signal applied at the DUT Input Reference Plane will be distorted by the Source Tuner 54. Also, if the Source Tuner 54 is only calibrated at $F_C$, the signal at $F_C$ will be known, but the signal power and phase at the DUT Input Reference Plane across the modulation bandwidth will be unknown.

Figure 6:
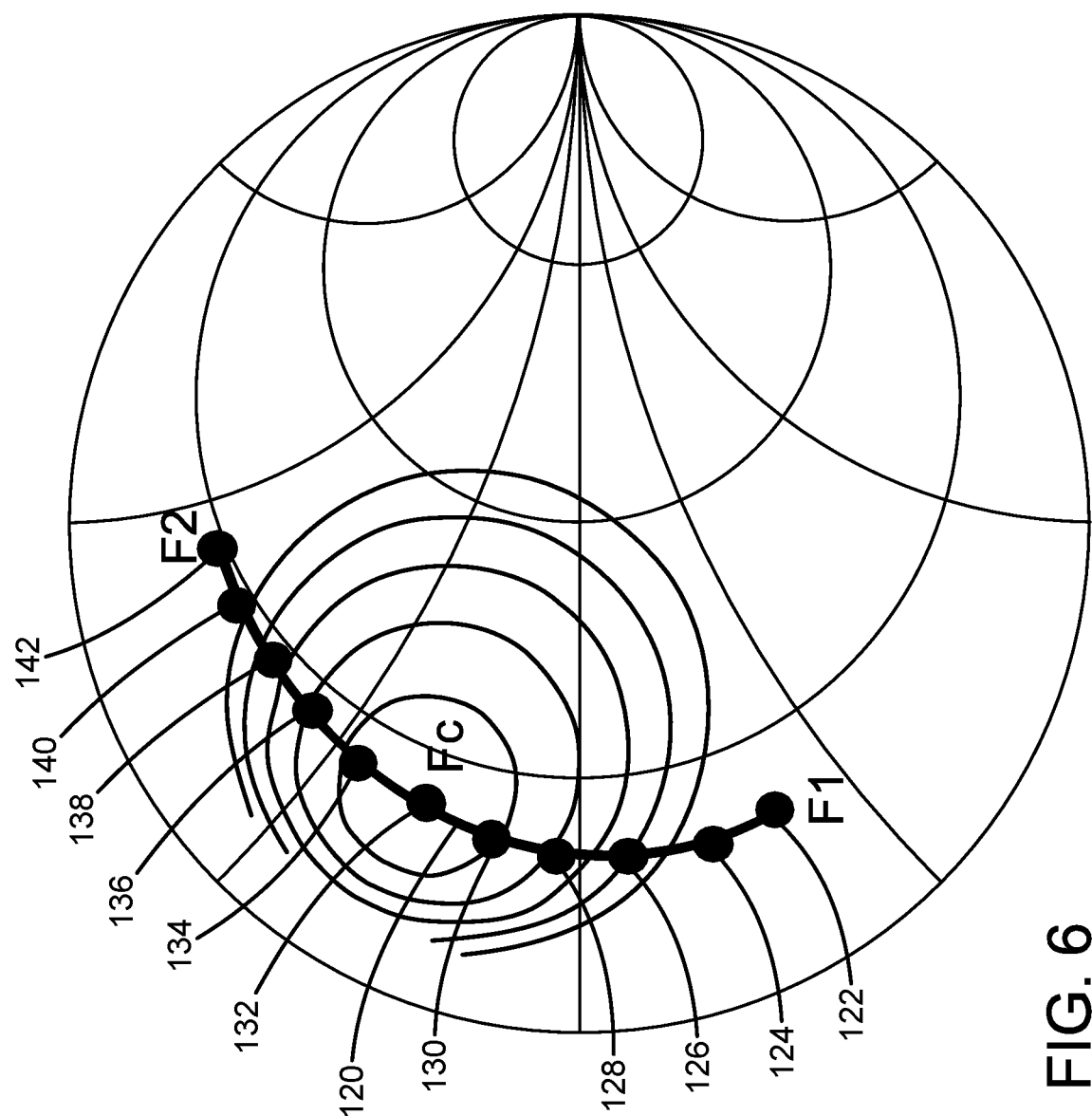
FIG. 6 shows a curve representing the impedance variation of a passive tuner over a modulation bandwidth, calibrated at multiple frequencies within the modulation bandwidth. It overlays a set of load pull contours to show the impedance context.

Passive tuners still have the advantage of simplicity of use, so it will be useful to solve the problem shown in FIG. 5. This invention solves that problem by calibrating the tuners at multiple frequencies over the modulation bandwidth as shown in FIG. 6. With this approach, the impedance seen by the DUT at the DUT Output Reference Plane will be accurately known at each calibrated frequency within the modulation band. The frequencies in this example are F1, F2 and $F_C$ as represented by dots 122, 142 and 132 in FIG. 6, and as well at intermediate frequencies within the bandwidth, represented in this example by dots 124, 126, 128, 130, 134, 136, 138, 140. Also, the measured power at the Power Meter Reference Plane can be de-embedded at each frequency within the modulation band to provide accurate data at the DUT Output Reference Plane. The controller 70 (FIG. 1) may be used to control the RF source and the tuners to achieve the multiple frequency calibration.

Figure 7:
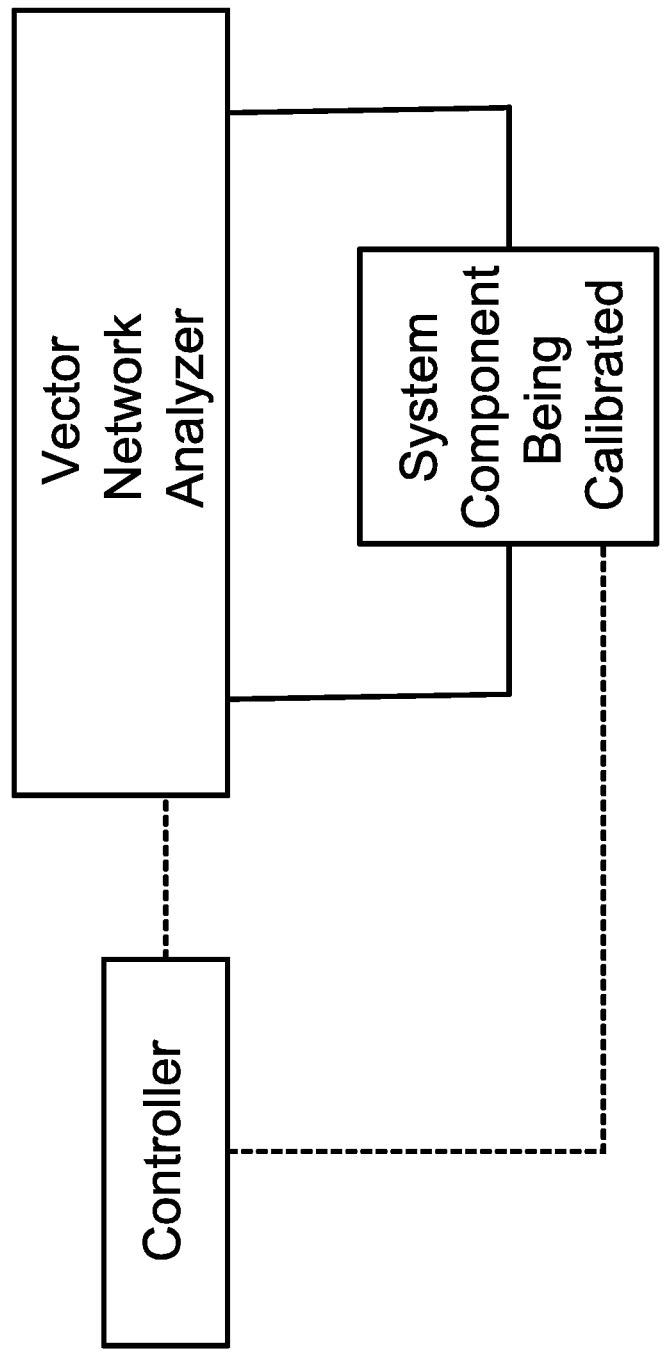
FIG. 7 shows a basic block diagram with a Vector Network Analyzer (VNA) being used to calibrate a system component.

The measurement setup in FIG. 7 may be used to calibrate the system components. The VNA must be first calibrated at the reference planes at which the components will be connected in the load pull setup. Fixed components, such as the coupler 58 in FIG. 1, require one s-parameter measurement at each frequency in the frequency list across the modulation bandwidth. Tuners must be calibrated at enough states to provide sufficient impedance coverage of the Smith chart. The selection of tuner states and the corresponding impedance coverage is similar to the prior art for CW measurements, except that the data will be taken at multiple frequencies across the modulation bandwidth.

Note that to de-embed output power during the load pull measurement at separate frequencies within the modulation band, an instrument that can measure separate frequencies within the band, such as a spectrum analyzer, is generally required. Most power meters measure the total power of the entire modulation band. One exemplary approach is to use the power meter to measure the total power of the total modulation bandwidth and to use the spectrum analyzer to measure the power of every frequency in the modulation bandwidth relative to the highest power in the modulation bandwidth. The total power at the Power Meter Reference Plane then can be divided up and a value attributed to each frequency in the modulation bandwidth based on the relative data from the spectrum analyzer. The power at the Power Meter Reference Plane of each frequency in the modulation bandwidth can then be de-embedded separately to get the correct power at the DUT Output Reference Plane. Once the power at each frequency is known at the DUT Output Reference Plane, the power at all the frequencies across the modulation bandwidth can be summed to get the total power delivered to the DUT Output Reference Plane.

If the number of calibration frequencies shown in FIG. 6 is small, there will still be some error between them. This error will reduce as the number of calibrated frequencies within the modulation band is increased. However, even a small number of frequencies will significantly improve the accuracy, since interpolation between calibrated frequencies within the modulation band will often be quite effective. This is because the impedance swing of the tuner is usually quite linear vs. frequency over even fairly wide modulation bandwidths. Interpolation methods are discussed in U.S. Provisional Patent Application Ser. No. 62/559,455, filed Sep. 15, 2017, entitled Measurement System Configured for Measurements at Non-Calibrated Frequencies, the entire contents of which are incorporated herein by this reference.

An exemplary embodiment of this invention also solves the problem of the unknown signal at the DUT Input Reference Plane. By calibrating the source tuner 54 at multiple frequencies over the modulation bandwidth, similar to how the load tuner was calibrated in the preceding paragraphs, the signal at the RF Source Reference Plane can be de-embedded to the DUT Input Reference Plane across the modulation bandwidth. This allows the signal power and phase applied to the DUT input to be known across the modulation bandwidth.

An exemplary embodiment of this invention further solves the problem of the signal distortion at the DUT Input Reference Plane. The general concept of signal pre-distortion is well known in the art, and this general concept can now be applied to the source tuner 54 which has been calibrated at multiple frequencies over the modulation bandwidth. Given the modulation signal profile across the modulation bandwidth which is desired to be applied at the DUT Input Reference Plane, the signal can be pre-distorted using the source tuner 54 s-parameters at each frequency in the modulated bandwidth. If the RF Source then provides this pre-distorted signal at the RF Source Reference Plane, the source tuner 54 will then distort the pre-distorted signal such that at the DUT Input Reference Plane, the desired un-distorted signal will be applied to the DUT input. The signal profile comprises information about the signal, including the modulation type, modulation bandwidth, and modulation statistics such as the Complementary Cumulative Distribution Function (CCDF) or the Probability Distribution Function (PDF).

Figure 8:
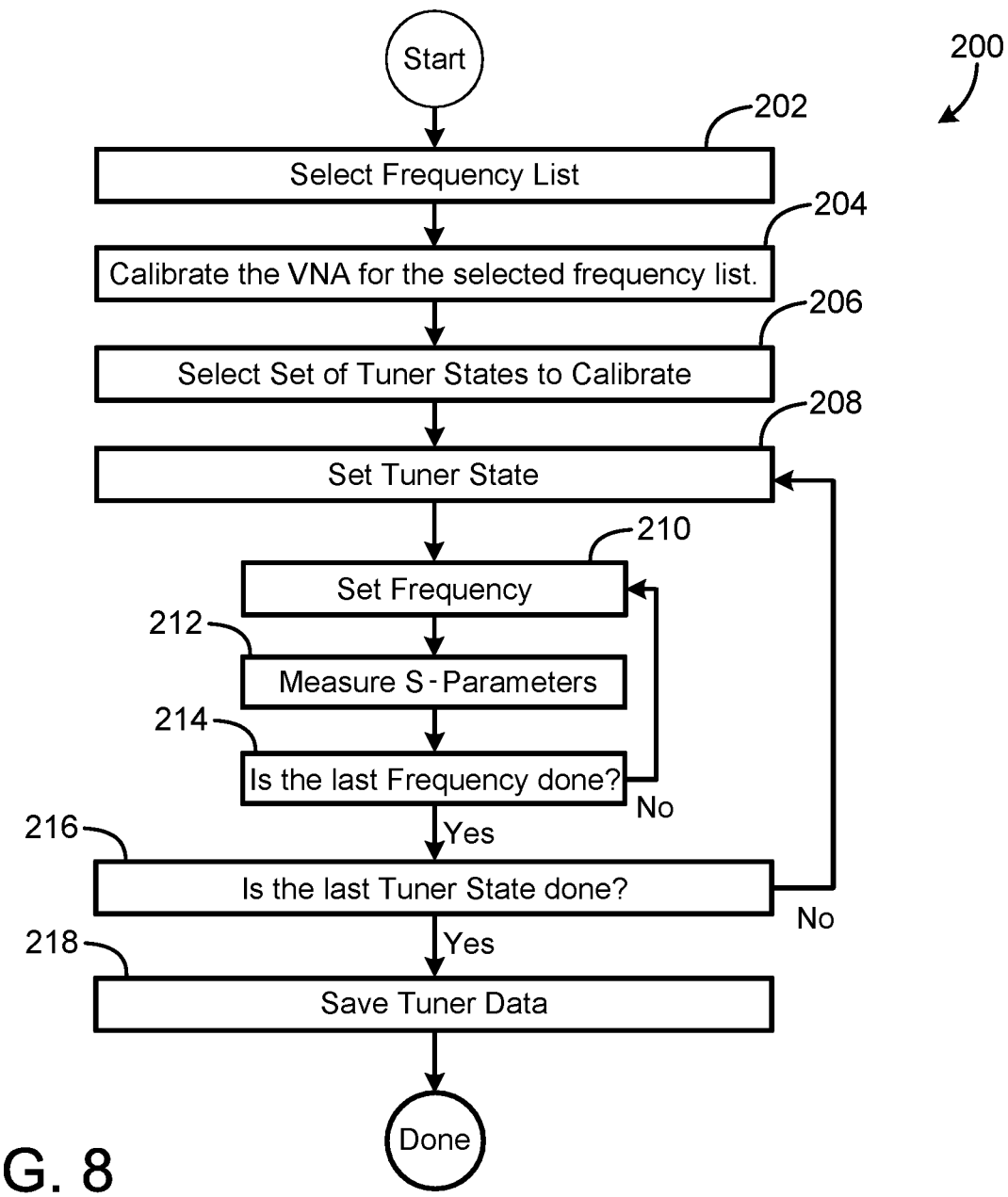
FIG. 8 is a flow diagram for one exemplary method of calibrating a passive tuner in preparation for a measurement with a wideband modulation signal.

FIG. 8 is a flow diagram for one exemplary method 200 of calibrating a tuner in preparation for a measurement with a wideband modulation signal, using the calibration setup illustrated in FIG. 7. The steps are:

Step 1 (202): Select the desired frequency list to cover the required modulation band.

Step 2 (204): Calibrate the Vector Network Analyzer (VNA) for s-parameter measurements over the selected frequency range. As in the prior art, this normally would be a VNA calibration for 2-port s-parameter measurements.

Step 3 (206): Select a set of tuner states to be calibrated.

Step 4 (208): Set a Tuner State from the selected set.

Step 5 (210): Set the VNA to a frequency selected from the selected frequency list.

Step 6 (212): Measure the s-parameters of the tuner using the VNA.

Step 7 (214): Repeat steps 5 and 6 until the s-parameters have been measured for all selected frequencies.

Step 8 (216): Repeat steps 4-7 until measurements of the s-parameters for all selected tuner states have been completed.

Step 9 (218): Save the tuner s-parameter data in memory, typically on the controller 70.

Variations of the above sequence may be done. For example, Steps 5-7 (210, 212, 214) are often automated in modern VNAs as a single step of taking a frequency sweep. Also, Step 3 (206) could have been done earlier in the sequence.

Figure 9:
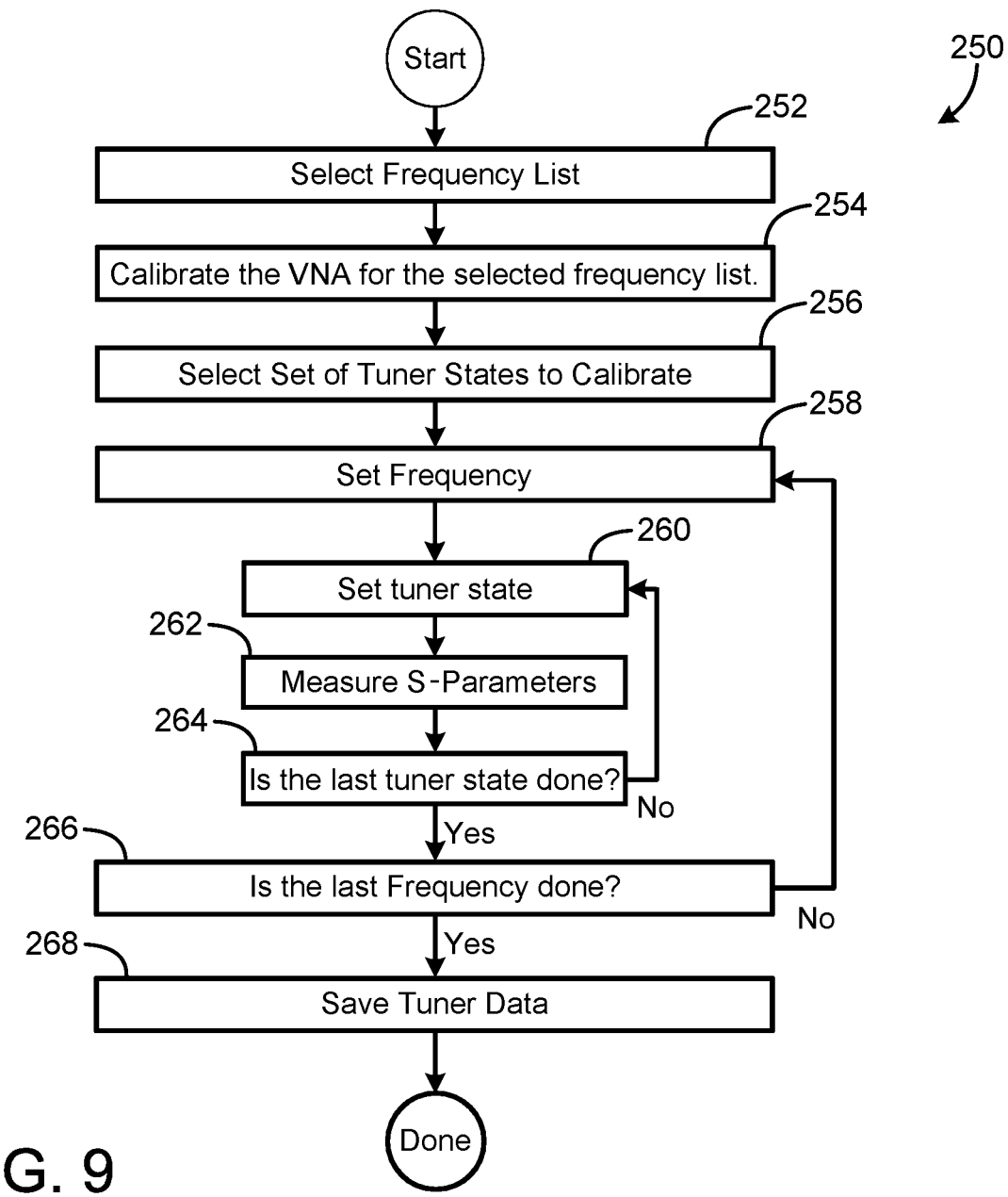
FIG. 9 is a flow diagram of another exemplary method of calibrating a passive tuner in preparation for a measurement with a wideband modulation signal.

Alternate sequences are possible. For example, the exemplary sequence of method 250 shown in FIG. 9 begins with steps 252, 254, 256 like the sequence of FIG. 8, but the inner and outer loops are exchanged. In FIG. 9, the frequencies are set one at a time in the outer loop at 258-266, and the selected tuner states are set and measured one at a time in the inner loop in the inner loop 260-264 at for each frequency. Once the s-parameters have been measured at all frequencies at 266, the measured tuner data is saved at 268. This sequence will usually be slower than the sequence of FIG. 8, but it illustrates how the details may be varied within the scope of this invention.

Figure 10:
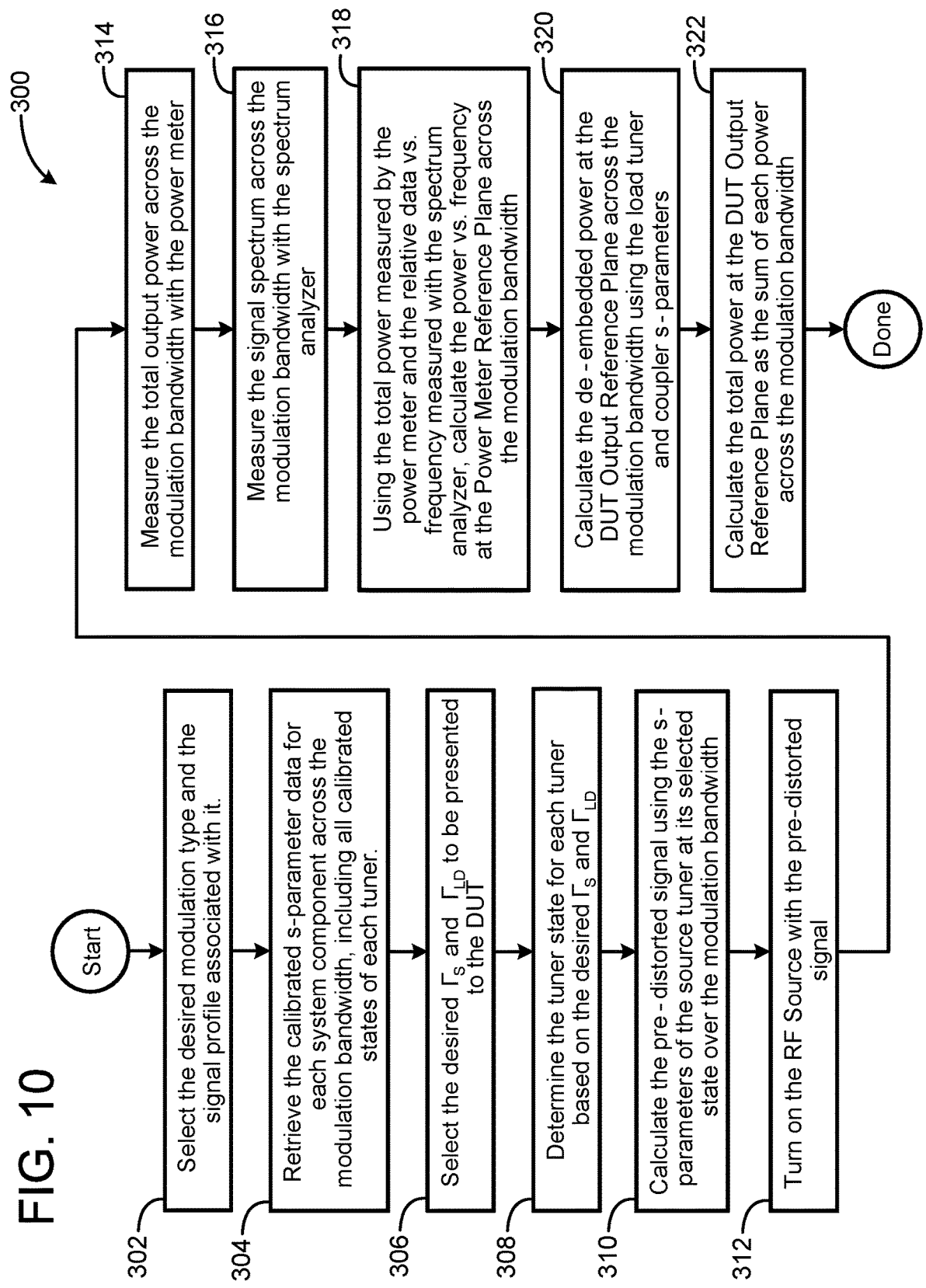
FIG. 10 is a flow diagram of an exemplary method of measuring a DUT with a modulated signal using passive tuners.

FIG. 10 shows the flow diagram of an exemplary measurement sequence 300 using the calibration data at multiple frequencies across a modulation bandwidth. It comprises the following steps:

Step 1 (302): Select the desired modulation type and the signal profile associated with it.

Step 2 (304): Retrieve the calibrated s-parameter data for each system component across the modulation bandwidth, including all calibrated states of each tuner.

Step 3 (306): Select the desired $\Gamma_S$ and $\Gamma_{LD}$ to be presented to the DUT.

Step 4 (308): Determine the tuner state for each tuner based on the desired $\Gamma_S$ and $\Gamma_{LD}$. This will typically be the state that produces $\Gamma_S$ or $\Gamma_{LD}$ at $F_C$. The impedance away from $F_C$ cannot be controlled independently, but with an exemplary embodiment of this invention, it may be known and measured data de-embedded correctly.

Step 5 (310): Calculate the pre-distorted signal using the s-parameters of the source tuner at its selected state over the modulation bandwidth.

Step 6 (312): Turn on the RF Source with the pre-distorted signal.

Step 7 (314): Measure the total output power across the modulation bandwidth with the power meter.

Step 8 (316): Measure the signal spectrum across the modulation bandwidth with the spectrum analyzer.

Step 9 (318): Using the total power measured by the power meter and the relative data vs. frequency measured with the spectrum analyzer, calculate the power vs. frequency at the Power Meter Reference Plane across the modulation bandwidth.

Step 10 (320): Calculate the de-embedded power at the DUT Output Reference Plane across the modulation bandwidth using the load tuner and coupler s-parameters.

Step 11 (322): Calculate the total power at the DUT Output Reference Plane as the sum of each power across the modulation bandwidth.

Variations of the sequence in FIG. 10 are possible. For example, the power meter and spectrum analyzer may be replaced by other instruments to collect measured data. If a measurement instrument can accurately measure power at each frequency separately across the modulation bandwidth, steps 314-318 may be accomplished by a single swept measurement across the modulation bandwidth with that instrument. Another example is that the pre-distortion of the RF source signal could be skipped if this is not critical for the application, without skipping the correct output power de-embedding. Also, for finer resolution across the modulation bandwidth, the calibrated s-parameter data for each system component could be interpolated vs. frequency from the s-parameters of that component across the modulation bandwidth. In addition, de-embedding of the actual $\Gamma_S$ and $\Gamma_{LD}$ (or impedances) at selected or all frequencies within the modulation bandwidth may be done.

Although the foregoing has been a description and illustration of specific embodiments of the subject matter, various modifications and changes thereto can be made by persons skilled in the art without departing from the scope and spirit of the invention.

What is claimed is:

1. A load pull system for conducting measurements on a Device Under Test (DUT), comprising:
    at least one passive impedance tuner calibrated at multiple frequencies within a modulation band:
    a modulated source signal having the modulation band centered at a center frequency, the modulated source signal connected to a DUT input,
    at least one signal measurement instrument, including an instrument configured to receive output signals from the DUT and to measure signals at separate frequencies within the modulation band;
    a memory for storing a calibration data set, said calibration data set including calibration data for said passive impedance tuner at said multiple frequencies within the modulation band of said modulated source signal;
    a controller configured to control the passive impedance tuner to set the passive impedance tuner at different impedance states;
    wherein the measurements on the DUT include measurements resulting from said modulated source signal at one or more frequencies within the modulation band; and
    wherein the controller is configured to de-embed said measurements to a DUT reference plane at one or more frequencies within the modulation band.

2. The load pull system of claim 1 where the controller is configured to determine the impedance at the DUT reference plane using tuner s-parameters at multiple frequencies within the said modulation band.

3. The load pull system of claim 1 where measured data from the instrument is de-embedded to the DUT reference plane using tuner s-parameters at said multiple frequencies within said modulation band.

4. The load pull system of claim 1 where the controller is configured to de-embed the impedance at the DUT reference plane and/or measured data from an instrument between the multiple frequencies at which the passive impedance tuner was calibrated within the modulation band using interpolation of the tuner s-parameters versus frequency.

5. The load pull system of claim 1 where at least one said passive impedance tuner is connected to an output of the DUT.

6. The load pull system of claim 1 where at least one said passive impedance tuner is a source tuner connected to the input of the DUT.

7. The load pull system of claim 6 where the said modulated source signal is pre-distorted using the source tuner s-parameters such that a desired modulated signal is applied at the DUT Input Reference Plane.

8. The load pull system of claim 1 where a bandwidth of the modulation band is greater than 0.56% of the center frequency of the modulated source signal.

9. The load pull system of claim 1 where the said load pull system is a passive load pull system.

10. The load pull system of claim 1, wherein the controller is further configured to:
    measure a total output power across the modulation band;
    measure a signal spectrum across the modulated band;
    determine a power versus frequency relationship at the DUT reference plane across the modulation band;
    determine the de-embedded power at said DUT reference plane across the modulation band using calibrated s-parameters for at least some of the system components including the at least one passive impedance tuner; and
    determine a total power at said DUT reference plane as a sum of each power across the modulation band.

11. The load pull system of claim 1, wherein the controller is further configured to:
    determine impedances at the DUT reference plane at interpolated frequencies between the multiple frequencies within the modulation band using interpolation of a stored calibration data set for the at least one passive impedance tuner.

12. The load pull system of claim 1, wherein said calibration data set comprises tuner s-parameters, and the controller is further configured to:
    de-embed measured data from an instrument to the DUT reference plane using tuner s-parameters at interpolated frequencies between said multiple frequencies within the modulation band of the modulated source signal.

13. The load pull system of claim 1, wherein said calibration data comprises tuner s-parameters, and the controller is further configured control a signal source providing the modulated source signal to pre-distort said modulated source signal at interpolated frequencies between said multiple frequencies within the modulation band using source tuner s-parameters such that a desired modulated signal is applied at the DUT Input Reference Plane.

14. The load pull system of claim 1, wherein the DUT reference plane is a DUT output reference plane.

15. A load pull system for conducting measurements on a Device Under Test (DUT), comprising:
    at least one passive impedance tuner calibrated at multiple frequencies within a modulation band;
    a modulated source signal having the modulation band centered at a center frequency, the modulated source signal connected to a DUT input,
    at least one signal measurement instrument, including an instrument configured to receive output signals from the DUT and to measure signals at separate frequencies within the modulation band:
    a calibration data set including calibration data for said at least one passive impedance tuner at said multiple frequencies within the modulation band of said modulated source signal;
    a controller configured to control the passive tuner to set the tuner at different impedance states;
    wherein the measurements on the DUT include measurements resulting from said modulated source signal at one or more frequencies within the modulation band.

16. The load pull system of claim 15, wherein the controller is configured to de-embed said measurements to a DUT reference plane at one or more frequencies within the modulation band.

17. The load pull system of claim 16, wherein the DUT reference plane is a DUT output reference plane.

18. The load pull system of claim 15, wherein the controller is configured to determine the impedance at a DUT reference plane using tuner s-parameters at multiple frequencies within the said modulation band.

19. The load pull system of claim 15 where measured data from the instrument is de-embedded to a DUT reference plane using tuner s-parameters at said multiple frequencies within said modulation band.

20. The load pull system of claim 15 wherein the controller is configured to de-embed the impedance at a DUT reference plane and/or measured data from the instrument between the multiple frequencies at which the at least one passive impedance tuner was calibrated within the modulation band using interpolation of a tuner s-parameters versus frequency.

21. The load pull system of claim 15 where at least one said passive impedance tuner is connected to an output of the DUT.

22. The load pull system of claim 15 where at least one said passive impedance tuner is a source tuner connected to an input of the DUT.

23. The load pull system of claim 22 where the said modulated source signal is pre-distorted using a source tuner s-parameters such that a desired modulated signal is applied at a DUT Input Reference Plane.

24. The load pull system of claim 15 where a bandwidth of the modulation band is greater than 0.56% of the center frequency of the modulated source signal.

25. The load pull system of claim 15, wherein the controller is further configured to:
   measure a total output power across the modulation band;
   measure a signal spectrum across the modulated band;
   determine a power versus frequency relationship at a DUT reference plane across the modulation band;
   determine the de-embedded power at said DUT reference plane across the modulation band using calibrated s-parameters for at least some of the system components including the at least one passive impedance tuner; and
   determine a total power at said DUT reference plane as a sum of each power across the modulation band.

* * * * *